United States Patent
Zhang et al.

(10) Patent No.: US 11,335,756 B2
(45) Date of Patent: May 17, 2022

(54) OLED DISPLAY DEVICE AND MANUFACTURING METHOD OF TFT ARRAY SUBSTRATE

(71) Applicant: SHENZHEN CHINA STAR OPTOELECTRONICS SEMICONDUCTOR DISPLAY TECHNOLOGY CO., LTD., Guangdong (CN)

(72) Inventors: Letao Zhang, Guangdong (CN); Xiaoxing Zhang, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 179 days.

(21) Appl. No.: 16/757,510

(22) PCT Filed: Mar. 13, 2020

(86) PCT No.: PCT/CN2020/079107
§ 371 (c)(1),
(2) Date: Apr. 20, 2020

(87) PCT Pub. No.: WO2021/164075
PCT Pub. Date: Aug. 26, 2021

(65) Prior Publication Data
US 2021/0408192 A1     Dec. 30, 2021

(30) Foreign Application Priority Data

Feb. 21, 2020 (CN) .......................... 202010107341.4

(51) Int. Cl.
*H01L 27/14* (2006.01)
*H01L 27/32* (2006.01)
*H01L 27/12* (2006.01)

(52) U.S. Cl.
CPC ...... *H01L 27/3262* (2013.01); *H01L 27/1225* (2013.01); *H01L 27/1251* (2013.01);
(Continued)

(58) Field of Classification Search
CPC ............ H01L 27/3262; H01L 27/1225; H01L 27/1251; H01L 27/3265; H01L 27/3272; H01L 27/3276
(Continued)

(56) References Cited

U.S. PATENT DOCUMENTS

2003/0109086 A1    6/2003   Arao
2010/0271349 A1*  10/2010  Liu .................... H01L 27/1229
                                                                        345/205
2019/0074383 A1    3/2019   Yu et al.

FOREIGN PATENT DOCUMENTS

CN    107452809 A    12/2017
CN    109326609 A     2/2019

* cited by examiner

*Primary Examiner* — Tan N Tran
(74) *Attorney, Agent, or Firm* — Dickinson Wright PLLC

(57) ABSTRACT

An OLED display device including an OLED pixel driving circuit is provided. A driving thin film transistor in the OLED pixel driving circuit is configured as a double gate oxide thin film transistor, and a switch thin film transistor is configured as a top gate self-aligned oxide thin film transistor. A manufacturing method of a TFT array substrate is also provided, and the TFT array substrate is used for preparing the OLED display device.

20 Claims, 4 Drawing Sheets

(52) U.S. Cl.
CPC ...... *H01L 27/3265* (2013.01); *H01L 27/3272* (2013.01); *H01L 27/3276* (2013.01)

(58) Field of Classification Search
USPC .................................................. 257/59, 72
See application file for complete search history.

OLED DISPLAY DEVICE AND MANUFACTURING METHOD OF TFT ARRAY SUBSTRATE

FIELD OF DISCLOSURE

The present application relates to the field of display technology, and particularly relates to an OLED display device and a manufacturing method of a TFT array substrate.

BACKGROUND OF DISCLOSURE

An organic light emitting diode (OLED) display device has many advantages, such as self-illumination, low driving voltage, high luminous efficiency, short response times, high definition and contrast, nearly 180° angle of view, wide operating temperature ranges, flexible display, and large area full-color display, etc., and is considered as the most promising display device in the industry.

In the current OLED pixel driving circuit, a 3T1C (i.e., a structure of three thin film transistors and a capacitor) circuit composed of a top gate self-aligned amorphous oxide TFT is generally used to drive the OLED to emit light. However, since the amorphous oxide is very sensitive to short wave light, a threshold voltage of the device will be reduced under the influence of light, thereby seriously affecting the luminous intensity of the OLED. Therefore, when making a back plate, a metal light-shielding layer is deposited first to protect the TFT (thin film transistor) device from ambient light at the bottom. However, simply introducing the light-shielding layer adds an additional yellow light process, but cannot increase the on-state current of the device.

Thus, when the existing OLED display device and the manufacturing method of the TFT array substrate uses the 3T1C pixel circuit, the use of the top gate self-aligned amorphous oxide TFT structure introduces the light-shielding layer, which adds the additional yellow light process, but cannot increase the on-state current of the device.

SUMMARY OF DISCLOSURE

Technical Problems

When the existing organic light emitting diode (OLED) display device and the manufacturing method of the TFT array substrate uses the 3T1C pixel circuit, the use of the top gate self-aligned amorphous oxide TFT structure introduces a light-shielding layer, which adds the additional yellow light process, but cannot increase the on-state current of the device.

Technical Solutions

In a first aspect, an embodiment of the present application provides an OLED display device comprising an OLED pixel driving circuit. The OLED pixel driving circuit comprises a first thin film transistor (T1), a second thin film transistor (T2), a third thin film transistor (T3), a storage capacitor (Cst), and an organic light-emitting diode. A drain of the first thin film transistor (T1) is connected to receive a power supply voltage (Vdd), and a source of the first thin film transistor (T1) is electrically connected to an anode of the organic light-emitting diode. A cathode of the organic light-emitting diode is connected to receive a common ground voltage. A gate of the second thin film transistor (T2) is connected to receive a first scan signal (Scan 1), a drain of the second thin film transistor (T2) is connected to receive a data signal line (Data), and a source of the second thin film transistor (T2) is electrically connected to a gate of the first thin film transistor (T1) and an end of the storage capacitor (Cst). The other end of the storage capacitor (Cst) is electrically connected to the source of the first thin film transistor (T1). A gate of the third thin film transistor (T3) is connected to receive a second scan signal (Scan 2), a source of the third thin film transistor (T3) is electrically connected to the source of the first thin film transistor (T1), and a drain of the third thin film transistor (T3) is electrically connected to a circuit switch (K).

The first thin film transistor (T1), the second thin film transistor (T2), and third thin film transistor (T3) are all disposed on a substrate in the same layer; the first thin film transistor (T1) is a double gate oxide thin film transistor, and the second thin film transistor (T2) and the third thin film transistor (T3) are both top gate self-aligned oxide thin film transistors. In a detection device for measuring the flicker of a display panel, the measurement probe comprises a plurality of photodiodes and a measurement subunit. The plurality of photodiodes are used to obtain the luminance signal of the display panel, and the measurement subunit is used to average at least one luminance signal to obtain an analog luminance waveform of the display panel.

In the OLED display device provided by an embodiment of the present application, the double gate oxide thin film transistor comprises: the substrate; a first bottom gate electrode formed on the substrate; a buffer layer formed on the first bottom gate electrode; a first semiconductor layer formed on the buffer layer; a first gate insulating layer formed on the first semiconductor layer; a first top gate electrode formed on the first gate insulating layer; an interlayer insulating layer formed on the buffer layer and completely covering the first semiconductor layer, the first gate insulating layer, and the first top gate electrode; a first source metal layer and a first drain metal layer formed on the interlayer insulating layer; a passivation layer formed on the interlayer insulating layer and completely covering the first source metal layer and the first drain metal layer. The double gate thin film transistor further comprises a first pixel electrode and a second pixel electrode, and the first pixel electrode and the second pixel electrode are formed on the passivation layer.

In the OLED display device provided by an embodiment of the present application, the first pixel electrode is electrically connected to the first bottom gate electrode by a first via, and the first pixel electrode is further electrically connected to the first top gate electrode by a second via. The second pixel electrode is electrically connected to the first drain metal layer by a third via. The first source metal layer and the first drain metal layer are electrically connected to the first semiconductor layer by a fourth via.

In the OLED display device provided by an embodiment of the present application, the top gate self-aligned oxide thin film transistor comprises: the substrate, a light-shielding layer formed on the substrate, and the buffer layer; a second semiconductor layer formed on the buffer layer, a second gate insulating layer formed on the second semiconductor layer, a second top gate electrode formed on the second gate insulating layer, the interlayer insulating layer, a second source metal layer and a second drain metal layer formed on the interlayer insulating layer, the passivation layer, and the second pixel electrode.

In the OLED display device provided by an embodiment of the present application, the second source metal layer and the second drain metal layer are electrically connected to the second semiconductor layer by a fifth via, and the second drain metal layer is further electrically connected to the light-shielding layer by a sixth via.

In the OLED display device provided by an embodiment of the present application, materials of all the buffer layer, the first gate insulating layer, the second gate insulating layer, the interlayer insulating layer, and the passivation layer are at least one of silicon dioxide, silicon nitride, and aluminum oxide.

In the OLED display device provided by an embodiment of the present application, materials of all the first bottom gate electrode, the light-shielding layer, the first top gate electrode, the first source metal layer, the first drain metal layer, the second top gate electrode, the second source metal layer, and the second drain metal layer are at least one of Mo, Al, Ti, and Cu.

In a second aspect, an embodiment of the present application further provides an OLED display device comprising an OLED pixel driving circuit. The OLED pixel driving circuit comprises a first thin film transistor (T1), a second thin film transistor (T2), a third thin film transistor (T3), a storage capacitor (Cst), and an organic light-emitting diode. A drain of the first thin film transistor (T1) is connected to receive a power supply voltage (Vdd), and a source of the first thin film transistor (T1) is electrically connected to an anode of the organic light-emitting diode. A cathode of the organic light-emitting diode is connected to receive a common ground voltage. A gate of the second thin film transistor (T2) is connected to receive a first scan signal (Scan 1), a drain of the second thin film transistor (T2) is connected to receive a data signal line (Data), and a source of the second thin film transistor (T2) is electrically connected to a gate of the first thin film transistor (T1) and an end of the storage capacitor (Cst). The other end of the storage capacitor (Cst) is electrically connected to the source of the first thin film transistor (T1). A gate of the third thin film transistor (T3) is connected to receive a second scan signal (Scan 2), a source of the third thin film transistor (T3) is electrically connected to the source of the first thin film transistor (T1), and a drain of the third thin film transistor (T3) is electrically connected to a circuit switch (K).

The first thin film transistor (T1) is a double gate oxide thin film transistor, and the second thin film transistor (T2) and the third thin film transistor (T3) are both top gate self-aligned oxide thin film transistors.

In the OLED display device provided by an embodiment of the present application, the double gate oxide thin film transistor comprises: the substrate; a first bottom gate electrode formed on the substrate; a buffer layer formed on the first bottom gate electrode; a first semiconductor layer formed on the buffer layer; a first gate insulating layer formed on the first semiconductor layer; a first top gate electrode formed on the first gate insulating layer; an interlayer insulating layer formed on the buffer layer and completely covering the first semiconductor layer, the first gate insulating layer, and the first top gate electrode; a first source metal layer and a first drain metal layer formed on the interlayer insulating layer; a passivation layer formed on the interlayer insulating layer and completely covering the first source metal layer and the first drain metal layer The double gate thin film transistor further comprises a first pixel electrode and a second pixel electrode, and the first pixel electrode and the second pixel electrode are formed on the passivation layer.

In the OLED display device provided by an embodiment of the present application, the first pixel electrode is electrically connected to the first bottom gate electrode by a first via, and the first pixel electrode is further electrically connected to the first top gate electrode by a second via. The second pixel electrode is electrically connected to the first drain metal layer by a third via. The first source metal layer and the first drain metal layer are electrically connected to the first semiconductor layer by a fourth via.

In the OLED display device provided by an embodiment of the present application, the top gate self-aligned oxide thin film transistor comprises: the substrate, a light-shielding layer formed on the substrate, and the buffer layer; a second semiconductor layer formed on the buffer layer, a second gate insulating layer formed on the second semiconductor layer, a second top gate electrode formed on the second gate insulating layer, the interlayer insulating layer, a second source metal layer and a second drain metal layer formed on the interlayer insulating layer, the passivation layer, and the second pixel electrode.

In the OLED display device provided by an embodiment of the present application, the second source metal layer and the second drain metal layer are electrically connected to the second semiconductor layer by a fifth via, and the second drain metal layer is further electrically connected to the light-shielding layer by a sixth via.

In the OLED display device provided by an embodiment of the present application, materials of all the buffer layer, the first gate insulating layer, the second gate insulating layer, the interlayer insulating layer, and the passivation layer are at least one of silicon dioxide, silicon nitride, and aluminum oxide.

In the OLED display device provided by an embodiment of the present application, materials of all the first bottom gate electrode, the light-shielding layer, the first top gate electrode, the first source metal layer, the first drain metal layer, the second top gate electrode, the second source metal layer, and the second drain metal layer are at least one of Mo, Al, Ti, and Cu.

In a third aspect, an embodiment of the present application further provides a manufacturing method of a TFT array substrate, and the TFT array substrate is used for preparing the OLED display device. The method comprises steps as follows.

A step S10, a first metal layer is prepared on a substrate, and the first metal layer is patterned into a first bottom gate electrode and a light-shielding layer by a first photomask.

A step S20, a buffer layer, a semiconductor layer, a gate insulating layer, and the first metal layer are sequentially prepared on the substrate, and a first semiconductor layer, a second semiconductor layer, a first gate insulating layer, a second gate insulating layer, a first top gate electrode, and a second top gate electrode are formed on the buffer layer using a half-tone mask plate as a second photomask.

A step S30, an interlayer insulating layer is prepared on the buffer layer, and a first through hole, a second through hole, a third through hole, a fourth through hole, and a fifth through hole are formed on the interlayer insulating layer using a half-tone mask plate as a third photomask.

A step S40, a second metal layer is deposited on the interlayer insulating layer, and the second metal layer is patterned into a first source metal layer, a first drain metal layer, a second source metal layer, and a second drain metal layer by a fourth photomask.

A step S50, a passivation layer is prepared on the interlayer insulating layer, the first bottom gate electrode, the first top gate electrode, and the first drain metal layer are exposed on the passivation layer by a fifth photomask, and a sixth through hole is formed on the first drain metal layer.

A step S60, an oxide metal layer is formed on the passivation layer, and the oxide metal layer is patterned into a first pixel electrode and a second pixel electrode by a sixth photomask. The first pixel electrode is electrically connected to the first bottom gate electrode by the first through hole, the first pixel electrode is further electrically connected to the first top gate electrode by the third through hole, and the second pixel electrode is further electrically connected to the first drain metal layer by the sixth through hole.

In the manufacturing method of the TFT array substrate provided by an embodiment of the present application, in the step S20, two ends of an edge of the first semiconductor layer and two ends of an edge of the second semiconductor layer are all subjected to a conductive treatment by a plasma treatment process. A plasma treatment gas in the plasma treatment process is at least one of Ar, He, and $N_2$.

In the manufacturing method of the TFT array substrate provided by an embodiment of the present application, in the step S20, materials of all the buffer layer, the first gate insulating layer, and the second gate insulating layer are at least one of silicon dioxide, silicon nitride, and aluminum oxide. Materials of the first semiconductor layer and the second semiconductor layer are at least one of IZO and IZTO. Materials of the first top gate electrode and the second top gate electrode are the same as a material of the first metal layer.

In the manufacturing method of the TFT array substrate provided by an embodiment of the present application, the step S30 further comprises steps as follows.

A step S301, an interlayer insulating layer is prepared on the buffer layer by a chemical vapor deposition method or a sputtering method. The interlayer insulating layer completely covers the first semiconductor layer, the second semiconductor layer, the first gate insulating layer, the second gate insulating layer, the first top gate electrode, and the second top gate electrode.

A step S302, an opening area of the buffer layer is etched using a half-tone mask plate as a third photomask, and the opening area corresponding to the interlayer insulating layer is ashed. The opening area corresponding to the interlayer insulating layer is above a source drain area and above the first top gate electrode.

A step S303, a first through hole, a second through hole, a third through hole, a fourth through hole, and a fifth through hole are finally formed on the interlayer insulating layer.

In the manufacturing method of the TFT array substrate provided by an embodiment of the present application, in the step S303, the first through hole exposes the first bottom gate electrode, the second through hole exposes the first semiconductor layer, the third through hole exposes the first top gate electrode, the fourth through hole exposes the second semiconductor layer, and the fifth through hole exposes the light-shielding layer.

In the manufacturing method of the TFT array substrate provided by an embodiment of the present application, in the step S40, the first source metal layer and the first drain metal layer are electrically connected to two ends of an edge of the first conductive layer by the second through hole, the second source metal layer and the second drain metal layer are electrically connected to two ends of an edge of the second conductive layer by the fourth through hole, and the second drain metal layer is electrically connected to the light-shielding layer by the fifth through hole.

Beneficial Effects

Compared with the prior art, the OLED display device and the manufacturing method of the TFT array substrate provided by the embodiments of the present application uses six photomasks to design the driving thin film transistor as the double gate oxide thin film transistor and to design the switch thin film transistor as the top gate self-aligned oxide thin film transistor. The channel width of the driving thin film transistor is reduced, and the parasitic effect of the switch thin film transistor is reduced. Thus, the pixel aperture ratio of the OLED display device is effectively increased, thereby improving the display effect of the OLED display device.

DETAILED DESCRIPTION OF PREFERRED EMBODIMENTS

The embodiments of the present application aims at the technical problems that when the existing organic light emitting diode (OLED) display device and the manufacturing method of the TFT array substrate uses a 3T1C pixel circuit, the use of the top gate self-aligned amorphous oxide TFT structure introduces a light-shielding layer, which adds an additional yellow light process, but cannot increase the on-state current of the device. The present embodiment can solve the defect.

Figure 1:
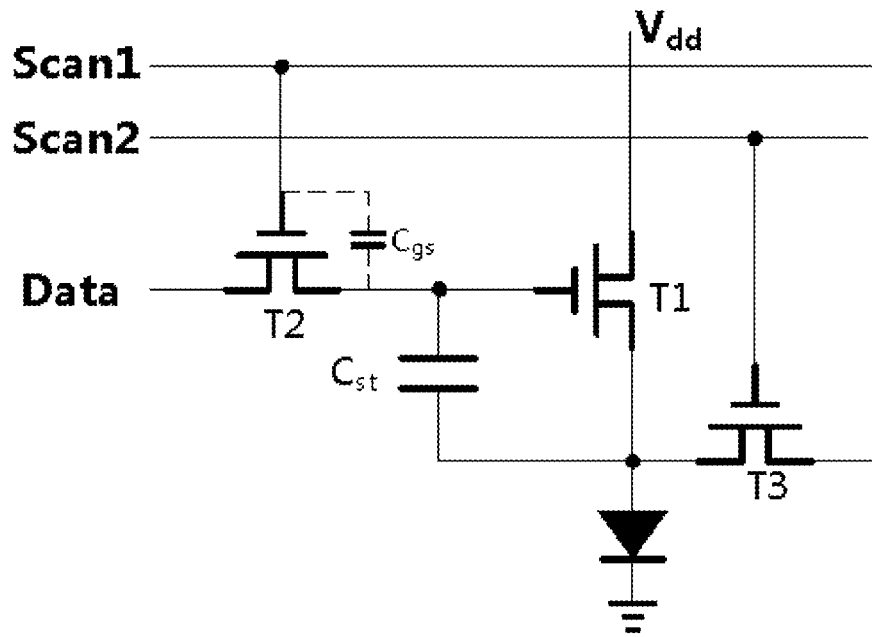
FIG. 1 is a circuit diagram of an organic light emitting diode (OLED) pixel driving circuit of a 3T1C structure of an OLED display device provided by an embodiment of the present application.

As shown in FIG. 1, FIG. 1 is a circuit diagram of an OLED pixel driving circuit of a 3T1C structure of an OLED display device provided by an embodiment of the present application. The OLED pixel driving circuit comprises a first thin film transistor (T1), a second thin film transistor (T2), a third thin film transistor (T3), a storage capacitor (Cst), and an organic light-emitting diode. A drain of the first thin film transistor (T1) is connected to receive a power supply voltage (Vdd), and a source of the first thin film transistor (T1) is electrically connected to an anode of the organic light-emitting diode. A cathode of the organic light-emitting diode is connected to receive a common ground voltage. A gate of the second thin film transistor (T2) is connected to receive a first scan signal (Scan 1), a drain of the second thin film transistor (T2) is connected to receive a data signal line (Data), and a source of the second thin film transistor (T2) is electrically connected to a gate of the first thin film transistor (T1) and an end of the storage capacitor (Cst). The other end of the storage capacitor (Cst) is electrically connected to the source of the first thin film transistor (T1). A gate of the third thin film transistor (T3) is connected to receive a second scan signal (Scan 2), a source of the third thin film transistor (T3) is electrically connected to the source of the first thin film transistor (T1), and a drain of the third thin film transistor (T3) is electrically connected to a circuit switch (K). The first thin film transistor (T1) is a double gate oxide thin film transistor, and the second thin film transistor (T2) and the third thin film transistor (T3) are both top gate self-aligned oxide thin film transistors.

As shown in FIG. 1, when the circuit switch (K) is connected, the first scan signal (Scan 1) and the second scan signal (Scan 2) first provide a high potential pulse, so that the second thin film transistor (T2) and the third thin film transistor (T3) are both turned on. In this stage, the power supply voltage Vdd enters the gate g of the first thin film transistor (T1) by the turned-on second thin film transistor (T2). That is, Vg=Vdd (Vg represents the potential of the gate g of the first thin film transistor (T1)). The data signal Data continues to be a high potential from the rise of the high potential pulse of the scan signal Scan. The data signal Data is written into the source s of the first thin film transistor (T1) by the turned-on third thin film transistor (T3). That is, Vs=VData (Vs represents the potential of the source s of the first thin film transistor (T1), and VData represents the potential of the data signal Data). After that, the scan signal Scan remains at a low potential, so that both the second thin film transistor (T2) and the third thin film transistor (T3) are turned off. The organic light emitting diode emits light depending on the storage function of the storage capacitor (Cst) for display.

Particularly, the parasitic capacitance between gate and source Cgs and the coupling capacitance between gate and drain Cgd of the first thin film transistor (T1) used for driving the pixel circuit only affect the charging time of the data signal Data, and the Cgs of the second thin film transistor (T2) used for switching the pixel circuit will affect the storage capacitor (Cst) and the potential of the gate g of the first thin film transistor (T1).

Since the double gate oxide thin film transistor increases the on-state current of the TFT device, thereby reducing the channel width of the device and increasing the pixel aperture ratio, the double gate oxide thin film transistor is used by the first thin film transistor (T1) of the embodiment of the present application to reduce the channel width, and the top gate self-aligned oxide thin film transistors are used by both the second thin film transistor (T2) and the third thin film transistor (T3) to reduce the parasitic effect of the device.

Figure 2:
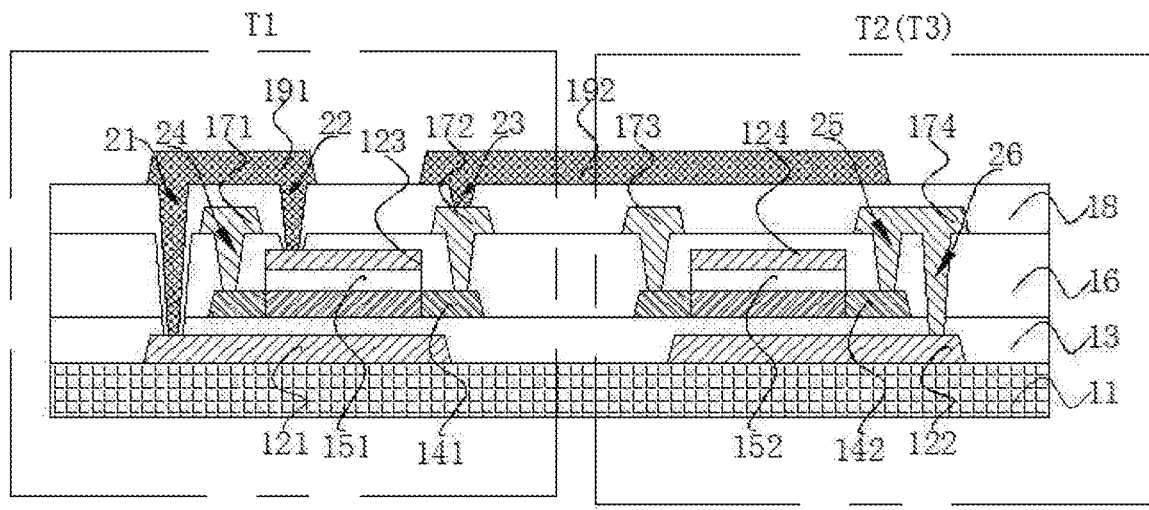
FIG. 2 is a schematic structural diagram of a TFT array substrate in an OLED display device provided by an embodiment of the present application.

As shown in FIG. 2, FIG. 2 is a schematic structural diagram of a TFT array substrate in an OLED display device provided by an embodiment of the present application. The first thin film transistor (T1), the second thin film transistor (T2), and third thin film transistor (T3) are all disposed on a substrate 11 in the same layer. The first thin film transistor (T1) is a double gate oxide thin film transistor, and the second thin film transistor (T2) and the third thin film transistor (T3) are both top gate self-aligned oxide thin film transistors.

Particularly, the double gate oxide thin film transistor (T1) comprises: the substrate 11; a first bottom gate electrode 121 formed on the substrate 11; a buffer layer 13 formed on the first bottom gate electrode 121; a first semiconductor layer 141 formed on the buffer layer 13; a first gate insulating layer 151 formed on the first semiconductor layer 141; a first top gate electrode 123 formed on the first gate insulating layer 151; an interlayer insulating layer 16 formed on the buffer layer 13 and completely covering the first semiconductor layer 141, the first gate insulating layer 151, and the first top gate electrode 123; a first source metal layer 171 and a first drain metal layer 172 formed on the interlayer insulating layer 16; a passivation layer 18 formed on the interlayer insulating layer 16 and completely covering the first source metal layer 171 and the first drain metal layer 172. The double gate thin film transistor (T1) further comprises a first pixel electrode 191 and a second pixel electrode 192, and the first pixel electrode 191 and the second pixel electrode 192 are formed on the passivation layer 18.

Particularly, the first pixel electrode 191 is electrically connected to the first bottom gate electrode 121 by a first via 21, and the first pixel electrode 191 is further electrically connected to the first top gate electrode 123 by a second via 22. The second pixel electrode 192 is electrically connected to the first drain metal layer 172 by a third via 23. The first source metal layer 171 and the first drain metal layer 172 are electrically connected to the first semiconductor layer 1471 by a fourth via 24.

Particularly, the top gate self-aligned oxide thin film transistors (T2 or T3) comprises: the substrate 11, a light-shielding layer 122 formed on the substrate 11, and the buffer layer 13; a second semiconductor layer 142 formed on the buffer layer 13, a second gate insulating layer 152 formed on the second semiconductor layer 142, a second top gate electrode 124 formed on the second gate insulating layer 152, the interlayer insulating layer 16, a second source metal layer 173 and a second drain metal layer 174 formed on the interlayer insulating layer 16, the passivation layer 18, and the second pixel electrode 192.

Particularly, the second source metal layer 173 and the second drain metal layer 174 are electrically connected to the second semiconductor layer 142 by a fifth via 25, and the second drain metal layer 174 is further electrically connected to the light-shielding layer 122 by a sixth via 26.

Particularly, materials of all the buffer layer 13, the first gate insulating layer 151, the second gate insulating layer 152, the interlayer insulating layer 16, and the passivation layer 18 are at least one of silicon dioxide, silicon nitride, and aluminum oxide.

Particularly, materials of the first semiconductor layer 141 and the second semiconductor layer 142 are at least one of IZO (indium zinc oxide) and IZTO (indium zinc tin oxide), and materials of the first pixel electrode 191 and the second pixel electrode 192 are ITO (indium tin oxide).

Particularly, materials of all the first bottom gate electrode 121, the light-shielding layer 122, the first top gate electrode 123, the first source metal layer 171, the first drain metal layer 172, the second top gate electrode 124, the second source metal layer 173, and the second drain metal layer 174 are at least one of Mo, Al, Ti, and Cu.

Figure 3:
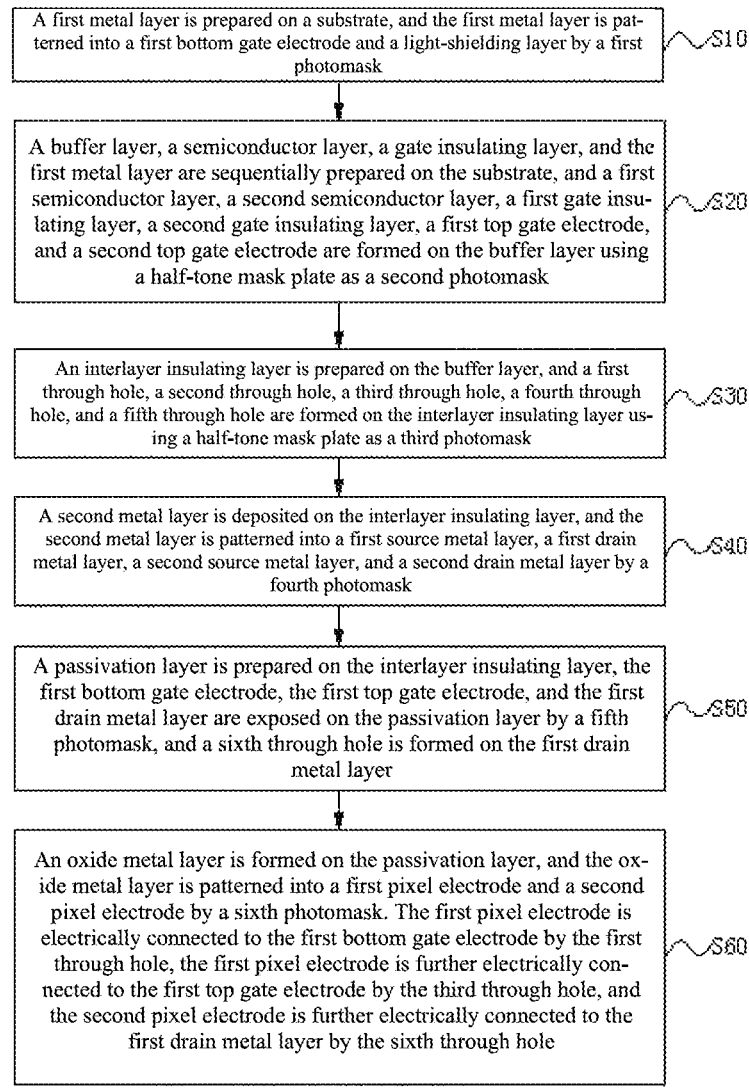
FIG. 3 is a flowchart of a manufacturing method of a TFT array substrate provided by an embodiment of the present application.

As shown in FIG. 3, FIG. 3 is a flowchart of a manufacturing method of a TFT array substrate provided by an embodiment of the present application. The method comprises steps as follows.

A step S10, a first metal layer 12 is prepared on a substrate 11, and the first metal layer 12 is patterned into a first bottom gate electrode 121 and a light-shielding layer 122 by a first photomask.

Particularly, the step S10 further comprises steps as follows.

Figure 4A:
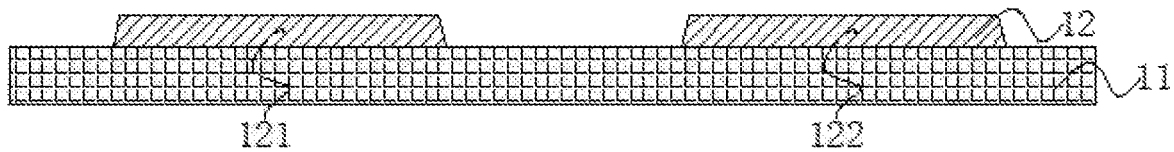
FIG. 4A to FIG. 4F are schematic structural diagrams of a manufacturing method of a TFT array substrate provided by an embodiment of the present application.

A substrate 11 is provided first, and the substrate is a glass substrate or a flexible substrate. Then, a first metal layer 12 is deposited on the substrate 11. A material of the first metal layer 12 is at least one of Mo, Al, Ti, and Cu. Finally, the first metal layer 12 is patterned into a first bottom gate electrode 121 and a light-shielding layer 122 by a mask plate as a first photomask, as shown in FIG. 4A.

A step S20, a buffer layer 13, a semiconductor layer 14, a gate insulating layer 15, and the first metal layer 12 are sequentially prepared on the substrate 11, and a first semiconductor layer 141, a second semiconductor layer 142, a first gate insulating layer 151, a second gate insulating layer 152, a first top gate electrode 123, and a second top gate electrode 124 are formed on the buffer layer 13 using a half-tone mask plate 21 as a second photomask.

Particularly, the step S20 further comprises steps as follows.

First, a buffer layer 13 is prepared on the substrate 11 by a chemical vapor deposition method or a sputtering method. The buffer layer 13 completely covers the first bottom gate electrode 121 and the light-shielding layer 122. After that, a semiconductor layer 14, a gate insulating layer 15, and the first metal layer 12 are sequentially prepared on the buffer layer 13. Then, the pattern of a semiconductor area is formed on the buffer layer 13, using a half-tone mask plate 21 as a second photomask. That is, a portion of the semiconductor layer 14, a portion of the gate insulating layer 15, and a portion of the first metal layer 12 outside the semiconductor area are respectively etched by wet etching, dry etching, and wet etching. After that, a portion of the gate insulating layer 15 and a portion of the first metal layer 12 in the source drain area are ashed, and a first top gate electrode 123 and a second top gate electrode 124 are formed. That is, a portion of the first metal layer 12 and a portion of the gate insulating layer 15 in the source drain area are respectively etched by wet etching and dry etching. Then, a first semiconductor layer 141, a second semiconductor layer 142, a first gate insulating layer 151, a second gate insulating layer 152, a first top gate electrode 123, and a second top gate electrode 124 are formed on the buffer layer 13. Particularly, materials of all the buffer layer 13, the first gate insulating layer 151, and the second gate insulating layer 152 are at least one of silicon dioxide, silicon nitride, and aluminum oxide, materials of the first semiconductor layer 141 and the second semiconductor layer 142 are at least one of indium zinc oxide (IZO) and indium zinc tin oxide (IZTO), and materials of both the first top gate electrode 123 and the second top gate electrode 124 are at least one of Mo, Al, Ti, and Cu.

Figure 4B:
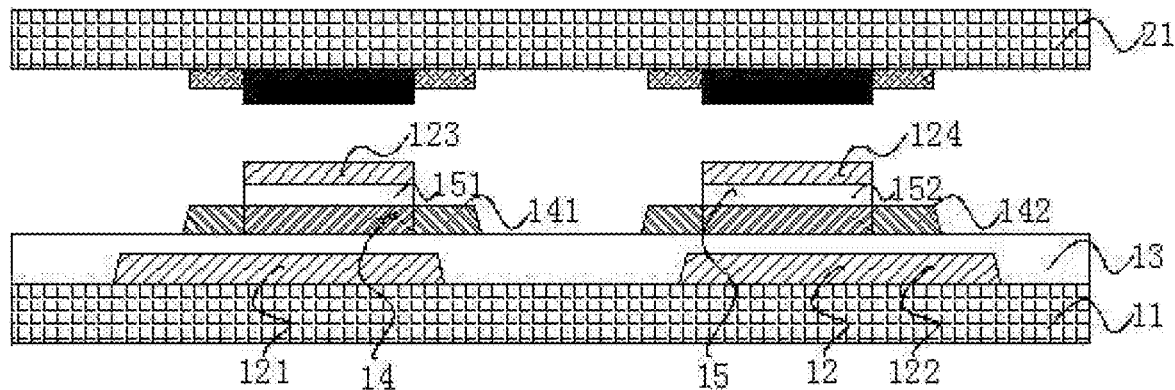

Finally, two ends of an edge of the first semiconductor layer 141 and two ends of an edge of the second semiconductor layer 142 are all subjected to a conductive treatment by a plasma treatment process to reduce the source drain parasitic resistance of the device. A plasma treatment gas in the plasma treatment process is at least one of Ar, He, and N$_2$, as shown in FIG. 4B.

A step S30, an interlayer insulating layer 16 is prepared on the buffer layer 13, and a first through hole 31, a second through hole 32, a third through hole 33, a fourth through hole 34, and a fifth through hole 35 are formed on the interlayer insulating layer 16 using a half-tone mask plate 22 as a third photomask.

Particularly, the step S30 further comprises steps as follows.

Figure 4C:
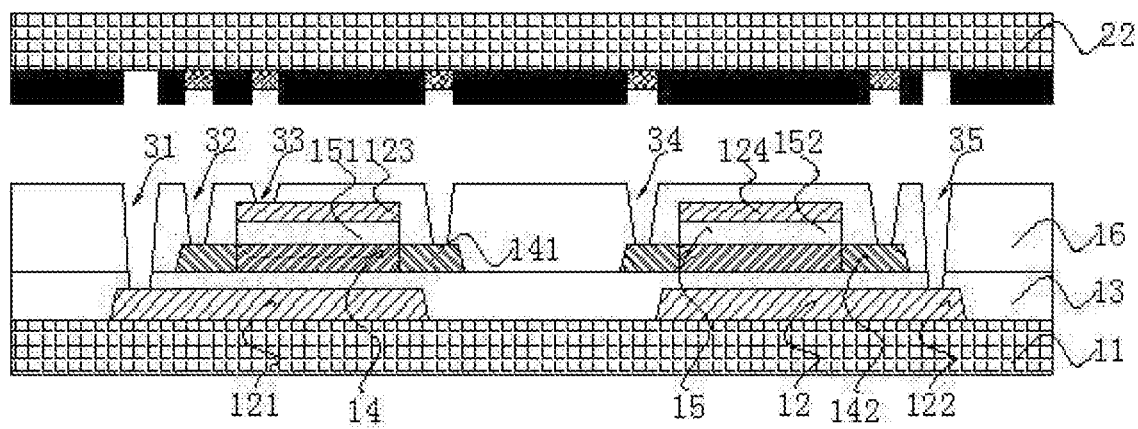

First, an interlayer insulating layer 16 is prepared on the buffer layer 13 by a chemical vapor deposition method or a sputtering method, and the interlayer insulating layer 16 completely covers the first semiconductor layer 141, the second semiconductor layer 142, the first gate insulating layer 151, the second gate insulating layer 152, the first top gate electrode 123, and the second top gate electrode 124. A material of the interlayer insulating layer 16 is at least one of silicon dioxide, silicon nitride, and aluminum oxide. After that, an opening area of the buffer layer 13 is etched using a half-tone mask plate 22 as a third photomask (at this time, a portion of the interlayer insulating layer 16 of the opening area of the buffer layer 13 will be etched). Then, the opening area corresponding to the interlayer insulating layer 16 is ashed, and the opening area corresponding to the interlayer insulating layer 16 is above the source drain area and above the first top gate electrode 123. When the interlayer insulating layer 16 is etched for the second time, the buffer layer in the opening area of the buffer layer 13 will be etched, thereby exposing the source drain electrode area, the light-shielding layer 122, the first top gate electrode 123, and the first bottom gate electrode 121 of the three TFTs. That is, a first through hole 31, a second through hole 32, a third through hole 33, a fourth through hole 34, and a fifth through hole 35 are formed on the interlayer insulating layer 16 using a half-tone mask plate 22 as a third photomask. The first through hole 31 exposes the first bottom gate electrode 121, the second through hole 32 exposes the first semiconductor layer 141, the third through hole 33 exposes the first top gate electrode 123, the fourth through hole 34 exposes the second semiconductor layer 142, and the fifth through hole 35 exposes the light-shielding layer 122, as shown in FIG. 4C.

a step S40, a second metal layer 17 is deposited on the interlayer insulating layer 17, and the second metal layer is patterned into a first source metal layer 171, a first drain metal layer 172, a second source metal layer 173, and a second drain metal layer 174 by a fourth photomask.

Particularly, the step S40 further comprises steps as follows.

Figure 4D:
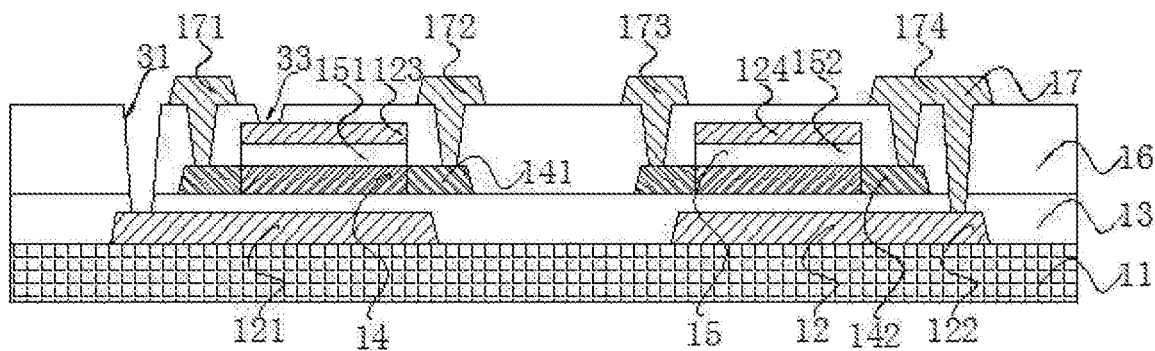

First, a second metal layer 17 is deposited on the interlayer insulating layer 16, and the second metal layer is patterned into a first source metal layer 171, a first drain metal layer 172, a second source metal layer 173, and a second drain metal layer 174 by a fourth photomask. The first source metal layer 171 and the first drain metal layer 172 are electrically connected to two ends of an edge of the first conductive layer 141 by the second through hole 32, the second source metal layer 173 and the second drain metal layer 174 are electrically connected to two ends of an edge of the second conductive layer 142 by the fourth through hole 34, and the second drain metal layer 174 is further electrically connected to the light-shielding layer 22 by the fifth through hole 35, as shown in FIG. 4D.

a step S50, a passivation layer 18 is prepared on the interlayer insulating layer 16, the first bottom gate electrode 121, the first top gate electrode 123, and the first drain metal layer 172 are exposed on the passivation layer 18 by a fifth photomask, and a sixth through hole 36 is formed on the first drain metal layer 172.

Particularly, the step S50 further comprises steps as follows.

Figure 4E:
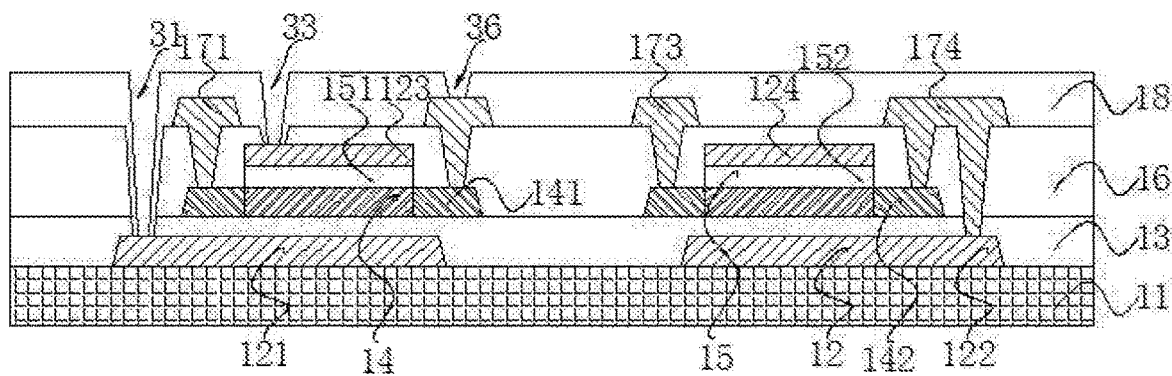

First, a passivation layer 18 is prepared on the interlayer insulating layer 16 by a chemical vapor deposition method or a sputtering method. The passivation layer 18 completely covers the first source metal layer 171, the first drain metal layer 172, the second source metal layer 173, and the second drain metal layer 174. A material of the passivation layer 18 is at least one of silicon dioxide, silicon nitride, and aluminum oxide. After that, the first bottom gate electrode 121, the first top gate electrode 123, and the first drain metal layer 172 are exposed on the passivation layer 18 by a fifth photomask, and a sixth through hole 36 is formed on the first drain metal layer 172, as shown in FIG. 4E.

A step S60, an oxide metal layer 19 is formed on the passivation layer 18, and the oxide metal layer 19 is patterned into a first pixel electrode 191 and a second pixel electrode 192 by a sixth photomask. The first pixel electrode 191 is electrically connected to the first bottom gate electrode 121 by the first through hole 31, the first pixel electrode 191 is further electrically connected to the first top gate electrode 123 by the third through hole 33, and the second pixel electrode 192 is further electrically connected to the first drain metal layer 172 by the sixth through hole 36.

Particularly, the step S60 further comprises steps as follows.

Figure 4F:
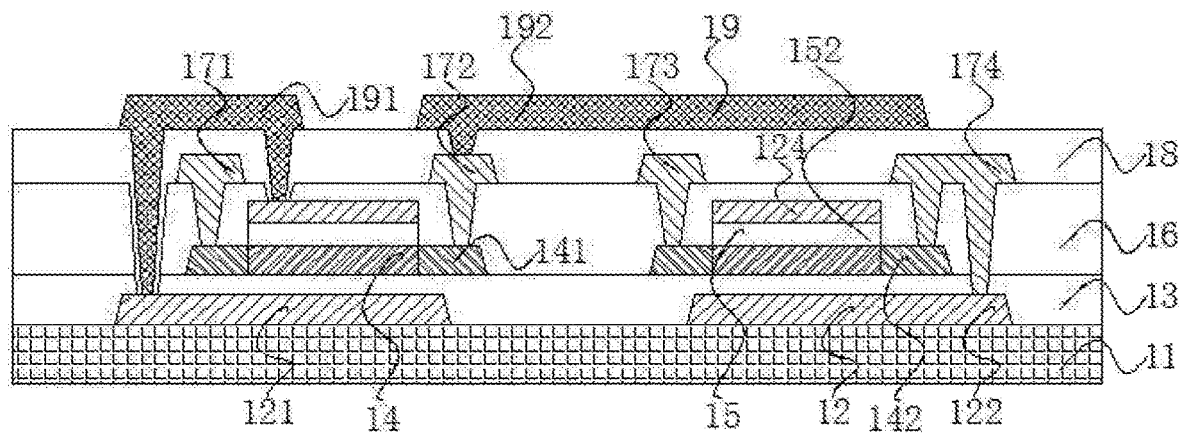

First, an oxide metal layer 19 is formed on the passivation layer 18, and a material of the oxide metal layer 19 is indium tin oxide (ITO). After that, the oxide metal layer 19 is patterned into a first pixel electrode 191 and a second pixel electrode 192 by a sixth photomask. The first pixel electrode 191 is electrically connected to the first bottom gate electrode 121 by the first through hole 31, the first pixel electrode 191 is further electrically connected to the first top gate electrode 123 by the third through hole 33, and the second pixel electrode 192 is further electrically connected to the first drain metal layer 172 by the sixth through hole 36. Finally, the TFT array substrate is prepared, as shown in FIG. 4F.

For the specific implementation of the above operations, refer to the previous embodiments, and they are not repeated here.

In summary, the OLED display device and the manufacturing method of the TFT array substrate provided by the embodiments of the present application use six photomasks to design the driving thin film transistor as the double gate oxide thin film transistor and to design the switch thin film transistor as the top gate self-aligned oxide thin film transistor. The channel width of the driving thin film transistor is reduced, and the parasitic effect of the switch thin film transistor is reduced. Thus, the pixel aperture ratio of the OLED display device is effectively increased, thereby improving the display effect of the OLED display device.

It can be understood that, for those skilled in the art, equivalent replacements or changes can be made according to the technical solutions and inventive concepts of the present application, and all such changes or replacements should fall within the protection scope of the claims appended to the present application.

What is claimed is:

1. An OLED display device, comprising an OLED pixel driving circuit, wherein the OLED pixel driving circuit comprises a first thin film transistor (T1), a second thin film transistor (T2), a third thin film transistor (T3), a storage capacitor (Cst), and an organic light-emitting diode; a drain of the first thin film transistor (T1) is connected to a power supply to receive a power supply voltage (Vdd), and a source of the first thin film transistor (T1) is electrically connected to an anode of the organic light-emitting diode; a cathode of the organic light-emitting diode is connected to a common ground to receive a common ground voltage; a gate of the second thin film transistor (T2) is connected to a first scan signal line to receive a first scan signal (Scan 1), a drain of the second thin film transistor (T2) is connected to a data signal line (Data) to receive a data signal, and a source of the second thin film transistor (T2) is electrically connected to a gate of the first thin film transistor (T1) and an end of the storage capacitor (Cst); an other end of the storage capacitor (Cst) is electrically connected to the source of the first thin film transistor (T1); a gate of the third thin film transistor (T3) is connected to a second scan signal line to receive a second scan signal (Scan 2), a source of the third thin film transistor (T3) is electrically connected to the source of the first thin film transistor (T1), and a drain of the third thin film transistor (T3) is electrically connected to a circuit switch (K);
wherein the first thin film transistor (T1), the second thin film transistor (T2), and third thin film transistor (T3) are all disposed on a substrate in a same layer; the first thin film transistor (T1) is a double gate oxide thin film transistor, and the second thin film transistor (T2) and the third thin film transistor (T3) are both top gate self-aligned oxide thin film transistors.

2. The OLED display device according to claim 1, wherein the double gate oxide thin film transistor comprises: a first bottom gate electrode formed on the substrate; a buffer layer formed on the first bottom gate electrode; a first semiconductor layer formed on the buffer layer; a first gate insulating layer formed on the first semiconductor layer; a first top gate electrode formed on the first gate insulating layer; an interlayer insulating layer formed on the buffer layer and completely covering the first semiconductor layer, the first gate insulating layer, and the first top gate electrode; a first source metal layer and a first drain metal layer formed on the interlayer insulating layer; a passivation layer formed on the interlayer insulating layer and completely covering the first source metal layer and the first drain metal layer; and the double gate thin film transistor further comprises a first pixel electrode and a second pixel electrode, wherein the first pixel electrode and the second pixel electrode are formed on the passivation layer.

3. The OLED display device according to claim 2, wherein the first pixel electrode is electrically connected to the first bottom gate electrode by a first via, and the first pixel electrode is further electrically connected to the first top gate electrode by a second via; the second pixel electrode is electrically connected to the first drain metal layer by a third via; and the first source metal layer and the first drain metal layer are electrically connected to the first semiconductor layer by a fourth via.

4. The OLED display device according to claim 2, wherein the top gate self-aligned oxide thin film transistor comprises: a light-shielding layer formed on the substrate, and the buffer layer; a second semiconductor layer formed on the buffer layer, a second gate insulating layer formed on the second semiconductor layer, a second top gate electrode formed on the second gate insulating layer, the interlayer insulating layer, a second source metal layer and a second drain metal layer formed on the interlayer insulating layer, the passivation layer, and the second pixel electrode.

5. The OLED display device according to claim 4, wherein the second source metal layer and the second drain metal layer are electrically connected to the second semiconductor layer by a fifth via, and the second drain metal layer is further electrically connected to the light-shielding layer by a sixth via.

6. The OLED display device according to claim 4, wherein materials of all the buffer layer, the first gate insulating layer, the second gate insulating layer, the interlayer insulating layer, and the passivation layer are at least one of silicon dioxide, silicon nitride, and aluminum oxide.

7. The OLED display device according to claim 4, wherein materials of all the first bottom gate electrode, the light-shielding layer, the first top gate electrode, the first source metal layer, the first drain metal layer, the second top gate electrode, the second source metal layer, and the second drain metal layer are at least one of Mo, Al, Ti, and Cu.

8. A manufacturing method of a TFT array substrate, wherein the TFT array substrate is used for preparing the OLED display device according to claim 1, and the method comprises:
a step S10 of preparing a first metal layer on a substrate, and patterning the first metal layer into a first bottom gate electrode and a light-shielding layer by a first photomask;
a step S20 of sequentially preparing a buffer layer, a semiconductor layer, a gate insulating layer, and the first metal layer on the substrate, and forming a first semiconductor layer, a second semiconductor layer, a first gate insulating layer, a second gate insulating layer, a first top gate electrode, and a second top gate electrode on the buffer layer using a half-tone mask plate as a second photomask;

a step S30 of preparing an interlayer insulating layer on the buffer layer, and forming a first through hole, a second through hole, a third through hole, a fourth through hole, and a fifth through hole on the interlayer insulating layer using a half-tone mask plate as a third photomask;

a step S40 of depositing a second metal layer on the interlayer insulating layer, and patterning the second metal layer into a first source metal layer, a first drain metal layer, a second source metal layer, and a second drain metal layer by a fourth photomask;

a step S50 of preparing a passivation layer on the interlayer insulating layer, exposing the first bottom gate electrode, the first top gate electrode, and the first drain metal layer on the passivation layer by a fifth photomask, and forming a sixth through hole on the first drain metal layer; and a step S60 of forming an oxide metal layer on the passivation layer, and patterning the oxide metal layer into a first pixel electrode and a second pixel electrode by a sixth photomask, wherein the first pixel electrode is electrically connected to the first bottom gate electrode by the first through hole, the first pixel electrode is further electrically connected to the first top gate electrode by the third through hole, and the second pixel electrode is further electrically connected to the first drain metal layer by the sixth through hole.

9. The manufacturing method of the TFT array substrate according to claim 8, wherein in the step S20, two ends of an edge of the first semiconductor layer and two ends of an edge of the second semiconductor layer are all subjected to a conductive treatment by a plasma treatment process; and a plasma treatment gas in the plasma treatment process is at least one of Ar, He, and N2.

10. The manufacturing method of the TFT array substrate according to claim 8, wherein in the step S20, materials of all the buffer layer, the first gate insulating layer, and the second gate insulating layer are at least one of silicon dioxide, silicon nitride, and aluminum oxide; materials of the first semiconductor layer and the second semiconductor layer are at least one of IZO and IZTO; and materials of the first top gate electrode and the second top gate electrode are the same as a material of the first metal layer.

11. The manufacturing method of the TFT array substrate according to claim 8, wherein the step S30 further comprises:

a step S301 of preparing an interlayer insulating layer on the buffer layer by a chemical vapor deposition method or a sputtering method, wherein the interlayer insulating layer completely covers the first semiconductor layer, the second semiconductor layer, the first gate insulating layer, the second gate insulating layer, the first top gate electrode, and the second top gate electrode;

a step S302 of etching on an opening area of the buffer layer using a half-tone mask plate as a third photomask, and ashing the opening area corresponding to the interlayer insulating layer, wherein the opening area corresponding to the interlayer insulating layer is above a source drain area and above the first top gate electrode; and a step S303 of finally forming a first through hole, a second through hole, a third through hole, a fourth through hole, and a fifth through hole on the interlayer insulating layer.

12. The manufacturing method of the TFT array substrate according to claim 11, wherein in the step S303, the first through hole exposes the first bottom gate electrode, the second through hole exposes the first semiconductor layer, the third through hole exposes the first top gate electrode, the fourth through hole exposes the second semiconductor layer, and the fifth through hole exposes the light-shielding layer.

13. The manufacturing method of the TFT array substrate according to claim 8, wherein in the step S40, the first source metal layer and the first drain metal layer are electrically connected to two ends of an edge of the first conductive layer by the second through hole, the second source metal layer and the second drain metal layer are electrically connected to two ends of an edge of the second conductive layer by the fourth through hole, and the second drain metal layer is electrically connected to the light-shielding layer by the fifth through hole.

14. An OLED display device, comprising an OLED pixel driving circuit, wherein the OLED pixel driving circuit comprises a first thin film transistor (T1), a second thin film transistor (T2), a third thin film transistor (T3), a storage capacitor (Cst), and an organic light-emitting diode; a drain of the first thin film transistor (T1) is connected to a power supply to receive a power supply voltage (Vdd), and a source of the first thin film transistor (T1) is electrically connected to an anode of the organic light-emitting diode; a cathode of the organic light-emitting diode is connected to a common ground to receive a common ground voltage; a gate of the second thin film transistor (T2) is connected to a first scan signal line to receive a first scan signal (Scan 1), a drain of the second thin film transistor (T2) is connected to a data signal line (Data) to receive a data signal, and a source of the second thin film transistor (T2) is electrically connected to a gate of the first thin film transistor (T1) and an end of the storage capacitor (Cst); an other end of the storage capacitor (Cst) is electrically connected to the source of the first thin film transistor (T1); a gate of the third thin film transistor (T3) is connected to a second scan signal line to receive a second scan signal (Scan 2), a source of the third thin film transistor (T3) is electrically connected to the source of the first thin film transistor (T1), and a drain of the third thin film transistor (T3) is electrically connected to a circuit switch (K);

wherein the first thin film transistor (T1) is a double gate oxide thin film transistor, and the second thin film transistor (T2) and the third thin film transistor (T3) are both top gate self-aligned oxide thin film transistors.

15. The OLED display device according to claim 14, wherein the double gate oxide thin film transistor comprises: a first bottom gate electrode formed on the substrate; a buffer layer formed on the first bottom gate electrode; a first semiconductor layer formed on the buffer layer; a first gate insulating layer formed on the first semiconductor layer; a first top gate electrode formed on the first gate insulating layer; an interlayer insulating layer formed on the buffer layer and completely covering the first semiconductor layer, the first gate insulating layer, and the first top gate electrode; a first source metal layer and a first drain metal layer formed on the interlayer insulating layer; a passivation layer formed on the interlayer insulating layer and completely covering the first source metal layer and the first drain metal layer; and the double gate thin film transistor further comprises a first pixel electrode and a second pixel electrode, wherein the first pixel electrode and the second pixel electrode are formed on the passivation layer.

16. The OLED display device according to claim 14, wherein the first pixel electrode is electrically connected to the first bottom gate electrode by a first via, and the first pixel electrode is further electrically connected to the first top gate electrode by a second via; the second pixel electrode is electrically connected to the first drain metal layer by a third via; and the first source metal layer and the first drain metal layer are electrically connected to the first semiconductor layer by a fourth via.

17. The OLED display device according to claim 14, wherein the top gate self-aligned oxide thin film transistor comprises: a light-shielding layer formed on the substrate, and the buffer layer; a second semiconductor layer formed on the buffer layer, a second gate insulating layer formed on the second semiconductor layer, a second top gate electrode formed on the second gate insulating layer, the interlayer insulating layer, a second source metal layer and a second drain metal layer formed on the interlayer insulating layer, the passivation layer, and the second pixel electrode.

18. The OLED display device according to claim 17, wherein the second source metal layer and the second drain metal layer are electrically connected to the second semiconductor layer by a fifth via, and the second drain metal layer is further electrically connected to the light-shielding layer by a sixth via.

19. The OLED display device according to claim 17, wherein materials of all the buffer layer, the first gate insulating layer, the second gate insulating layer, the interlayer insulating layer, and the passivation layer are at least one of silicon dioxide, silicon nitride, and aluminum oxide.

20. The OLED display device according to claim 17, wherein materials of all the first bottom gate electrode, the light-shielding layer, the first top gate electrode, the first source metal layer, the first drain metal layer, the second top gate electrode, the second source metal layer, and the second drain metal layer are at least one of Mo, Al, Ti, and Cu.

* * * * *